US012568841B2

(12) United States Patent
Oda et al.

(10) Patent No.: US 12,568,841 B2
(45) Date of Patent: Mar. 3, 2026

(54) SEMICONDUCTOR MODULE

(71) Applicant: FUJI ELECTRIC CO., LTD.,
Kawasaki (JP)

(72) Inventors: Yoshinori Oda, Matsumoto-city (JP);
Akira Iso, Kai-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 628 days.

(21) Appl. No.: 17/976,006

(22) Filed: Oct. 28, 2022

(65) Prior Publication Data

US 2023/0187320 A1     Jun. 15, 2023

(30) Foreign Application Priority Data

Dec. 9, 2021     (JP) ................................. 2021-199992

(51) Int. Cl.
| *H01L 23/49* | (2006.01) |
| *H01L 23/00* | (2006.01) |
| *H01L 23/053* | (2006.01) |
| *H01L 23/10* | (2006.01) |
| *H01L 23/40* | (2006.01) |
| *H01L 23/498* | (2006.01) |
| *H01L 23/544* | (2006.01) |
| *H01L 23/373* | (2006.01) |

(52) U.S. Cl.
CPC ............ *H01L 23/49* (2013.01); *H01L 23/053*
(2013.01); *H01L 23/10* (2013.01); *H01L*
*23/4006* (2013.01); *H01L 23/49811* (2013.01);
*H01L 23/544* (2013.01); *H01L 24/32*
(2013.01);

(Continued)

(58) Field of Classification Search
CPC ..... H01L 23/053; H01L 23/544; H01L 24/32;
H01L 23/10; H01L 23/49811; H01L
23/49; H01L 23/4006; H01L 2223/54426;
H01L 2223/54486; H01L 23/3735; H01L
23/055;

(Continued)

(56) References Cited

U.S. PATENT DOCUMENTS

| 2013/0250535 A1 | 9/2013 | Takamiya |
| 2013/0285231 A1 | 10/2013 | Kodaira |

(Continued)

FOREIGN PATENT DOCUMENTS

| JP | 2007-115987 A | 5/2007 |
| JP | 2018-107395 A | 7/2018 |

(Continued)

OTHER PUBLICATIONS

Office Action dated Nov. 11, 2025 issued in Japanese Application
No. 2021-199992.

*Primary Examiner* — Britt Hanley
*Assistant Examiner* — Victor V Barzykin

(57)     ABSTRACT

A semiconductor module includes a semiconductor element,
a case configured to house the semiconductor element, and
a plurality of control terminal units. Each of the control
terminal units includes at least one control terminal electri-
cally connected to the semiconductor element, and a guide
block constituted of a separate component from the case
fixed integrally to the at least one control terminal. The at
least one control terminal each includes a terminal pin part
protruding from an outer wall surface of the case. Each of
the guide blocks includes a guide pin part protruding from
the outer wall surface of the case in a direction the same as
the direction in which the terminal pin part protrudes. The
guide blocks of the control terminal units are constituted of
separate components.

14 Claims, 9 Drawing Sheets

(52) U.S. Cl.
CPC ............................... *H01L 23/3735* (2013.01);
*H01L 2223/54426* (2013.01); *H01L*
*2223/54486* (2013.01)

(58) Field of Classification Search
CPC ....................... H01L 23/492; H01L 23/49541;
H01L 25/072
See application file for complete search history.

(56) References Cited

U.S. PATENT DOCUMENTS

| | | | |
|---|---|---|---|
| 2014/0168922 A1 | 6/2014 | Kodaira | |
| 2014/0210067 A1 | 7/2014 | Takamiya et al. | |
| 2016/0225685 A1 | 8/2016 | Kodaira | |
| 2017/0018480 A1 | 1/2017 | Shigeta et al. | |
| 2017/0200704 A1* | 7/2017 | Kodaira ............. | H01L 23/3735 |
| 2018/0183161 A1 | 6/2018 | Soyano | |

FOREIGN PATENT DOCUMENTS

| | | |
|---|---|---|
| WO | 2012066833 A1 | 5/2012 |
| WO | 2013015031 A1 | 1/2013 |
| WO | 2013027826 A1 | 2/2013 |
| WO | 2013047101 A1 | 4/2013 |
| WO | 2015141325 A1 | 9/2015 |
| WO | 2016059916 A1 | 4/2016 |
| WO | 2016163237 A1 | 10/2016 |

* cited by examiner

SEMICONDUCTOR MODULE

CROSS REFERENCE TO RELATED APPLICATIONS

This application is based on, and claims priority from, Japanese Patent Application No. 2021-199992, filed Dec. 9, 2021, the entire content of which is incorporated herein by reference.

BACKGROUND OF THE INVENTION

Field of the Invention

The present disclosure relates to a semiconductor module.

Description of Related Art

A semiconductor module typified by a power semiconductor module generally includes semiconductor elements, a laminated plate including a wiring substrate on which the semiconductor elements are mounted, a case that houses the semiconductor elements, and a plurality of control terminals electrically connected to the semiconductor elements, respectively. For example, as disclosed in WO 2016/163237, the case is provided with a plurality of terminal holes penetrating through the case. Each of the control terminals has a portion to be inserted into any of the terminal holes and protrude on an outer wall surface of the case.

In WO 2016/163237, the case is provided with guide pins protruding along the protruding portions of the control terminals. These guide pins are used for positioning with respect to a substrate on which the semiconductor module is to be mounted.

In WO 2016/163237, the guide pins are fixed to the case while the control terminals are fixed to a base. Therefore, the erection tolerances at the fixing of these members affect the position tolerances of the control terminals and the guide pins. Accordingly, it is difficult to improve the position tolerances of the control terminals and the guide pins in the semiconductor module described in WO 2016/163237 and the semiconductor module is sometimes difficult to mount on a substrate.

SUMMARY

In view of the above circumstances, an aspect of the present disclosure is to provide a semiconductor module that is easy to mount on a substrate.

In order to solve the above problem, a semiconductor module according to a preferred aspect of the present disclosure includes: a semiconductor element; a case configured to house the semiconductor element; and a plurality of control terminal units each including at least one control terminal electrically connected to the semiconductor element, and a guide block constituted of a separate component from the case to be fixed integrally to the at least one control terminal. The at least one control terminal includes a terminal pin part protruding from an outer wall surface of the case, and the guide block includes a guide pin part protruding from the outer wall surface of the case in a direction the same as a direction in which the terminal pin part protrudes. The respective guide blocks of the plurality of control terminal units are constituted of separate components from each other.

BRIEF DESCRIPTION OF THE DRAWINGS

FIG. 1 is a plan view of a semiconductor module according to a first embodiment;

FIG. 2 is a sectional view along line A-A in FIG. 1;

DESCRIPTION OF THE EMBODIMENTS

Figure 3:
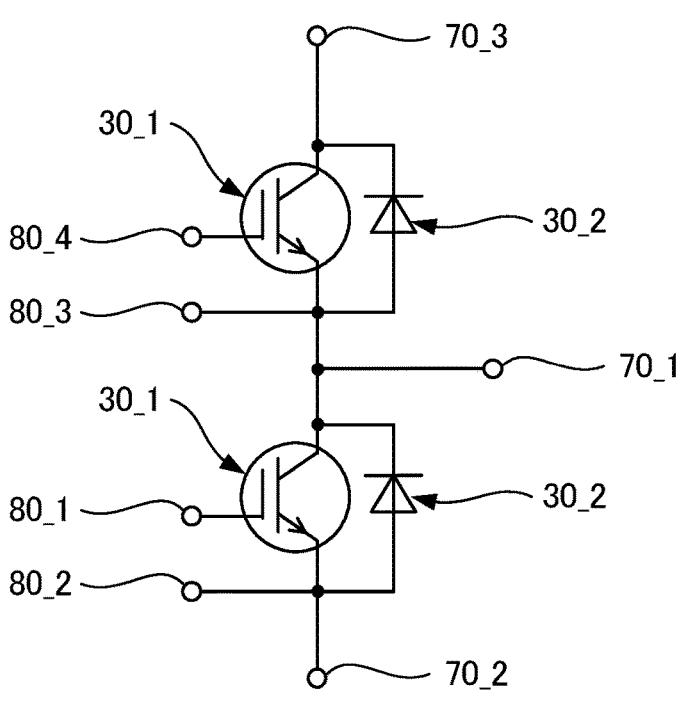
FIG. 3 is a circuit diagram of the semiconductor module.

Preferred embodiments according to the present disclosure are explained below with reference to the drawings. It is of note that the dimensions and scales of respective parts in the drawings are different from those of actual products as appropriate, and some parts are schematically illustrated to facilitate understanding. Furthermore, the scope of the present disclosure is not limited to the embodiments, unless otherwise stated in the following explanations that the present disclosure is so specifically limited.

1. First Embodiment

1-1. Overall Configuration of Semiconductor Module

Figure 1:
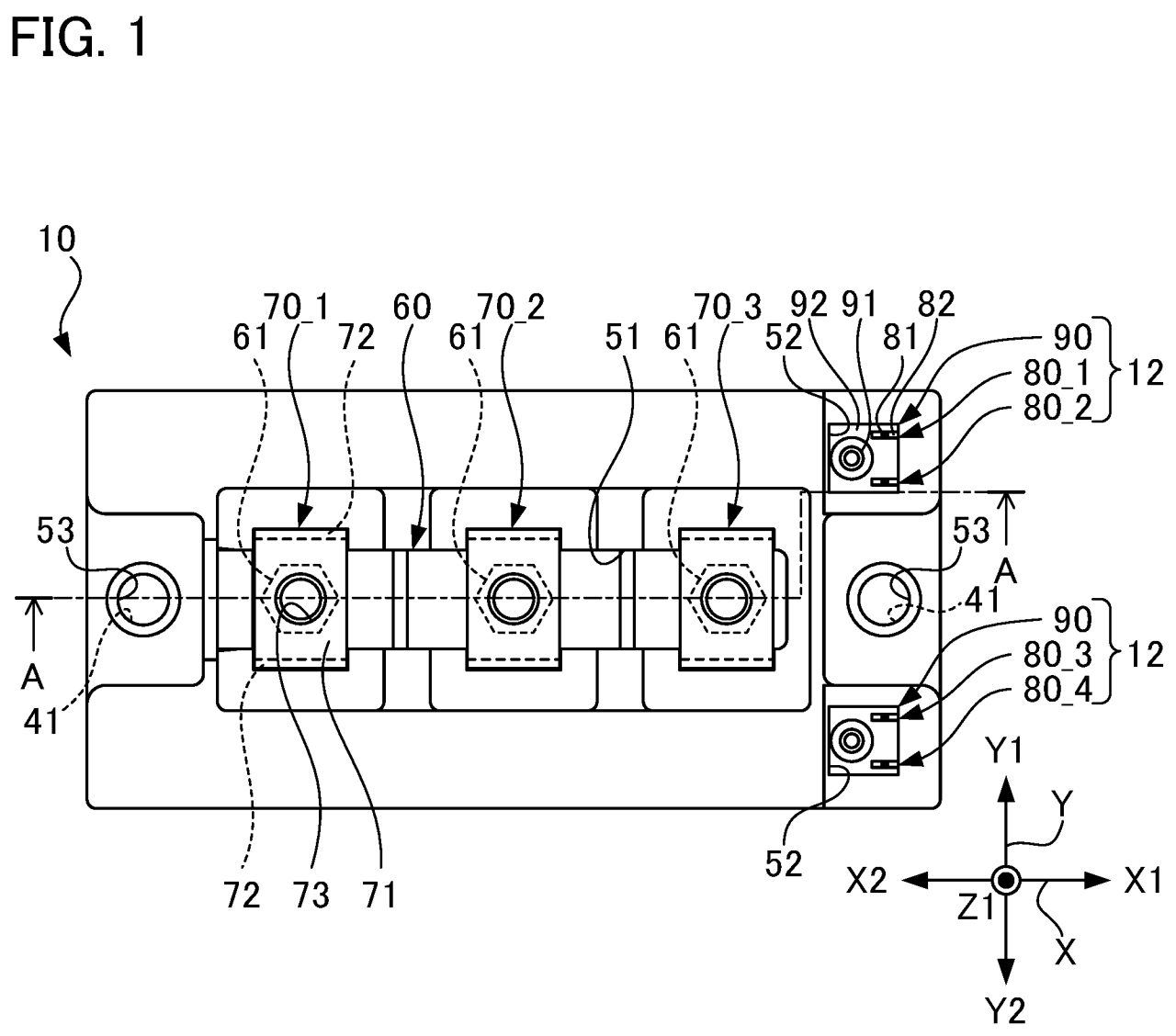
Figure 2:
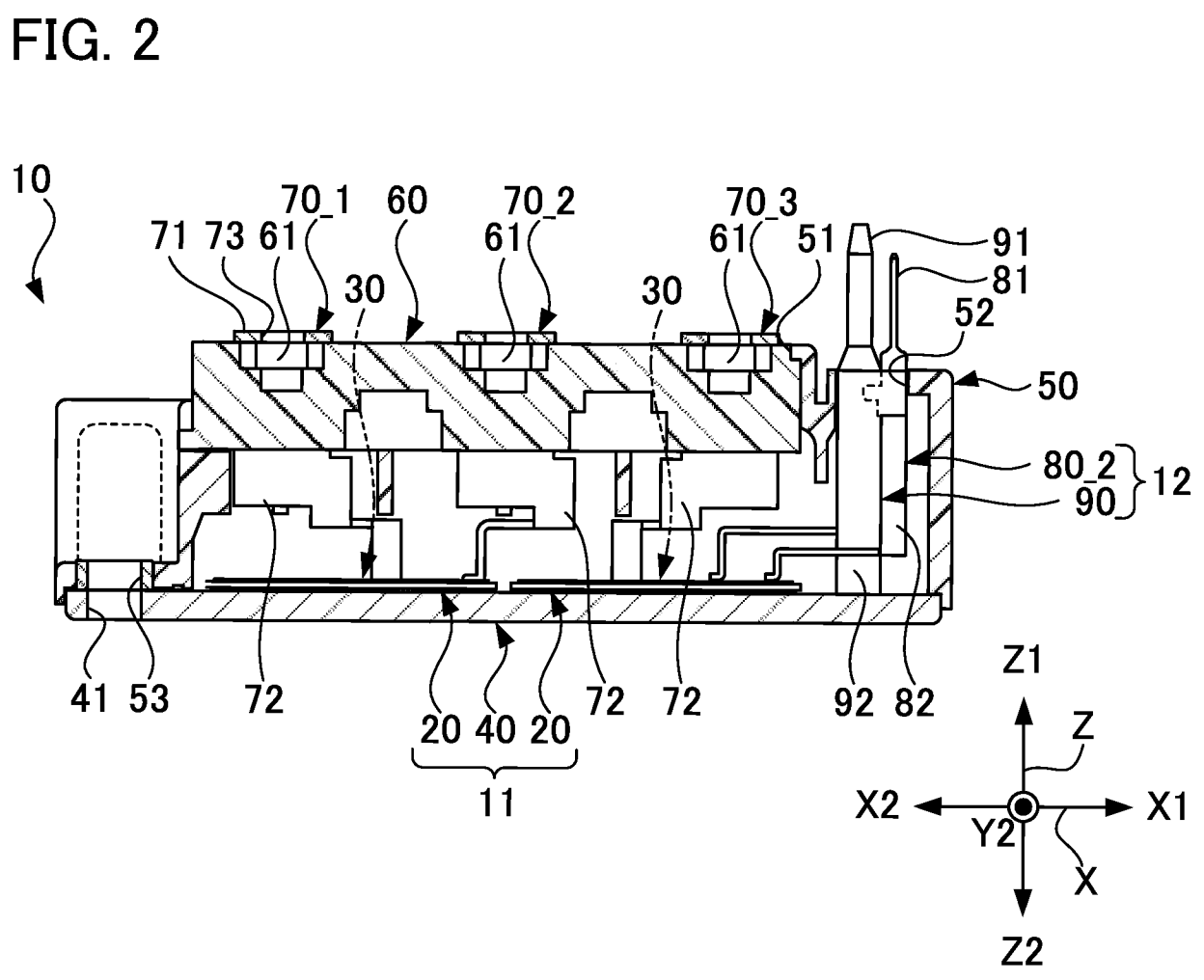

FIG. 1 is a plan view of a semiconductor module 10 according to a first embodiment. FIG. 2 is a sectional view along line A-A in FIG. 1. FIG. 3 is a circuit diagram of the semiconductor module 10. The semiconductor module 10 is a power module such as an IGBT (Insulated Gate Bipolar Transistor) module. The semiconductor module 10 is used, for example, for power control in an apparatus such as an inverter or a rectifier mounted to a railway vehicle, an automobile, or a device such as a household electrical machine.

As illustrated in FIGS. 1 and 2, the semiconductor module 10 includes a plurality of semiconductor elements 30, wiring substrates 20, a base 40, a case 50, a nut case 60, main terminals 70_1, 70_2, and 70_3, control terminals 80_1, 80_2, 80_3, and 80_4, and two guide blocks 90.

In this case, the wiring substrates 20 constitute a laminated plate 11 along with the base 40. The laminated plate 11 is a plate-like stacked body including at least the wiring substrates 20. In the present embodiment, the laminated plate 11 includes the base 40 as well as the wiring substrates 20. The control terminals 80_1 and 80_2 constitute a control terminal unit 12 along with one of the two guide blocks 90. Similarly, the control terminals 80_3 and 80_4 constitute a control terminal unit 12 along with the other one of the two guide blocks 90. Each of the control terminal units 12 is a structure obtained by integrating the control terminals 80_1 and 80_2 or the control terminals 80_3 and 80_4 and one of the guide blocks 90.

Hereinafter, each of the main terminals 70_1, 70_2, and 70_3 is sometimes referred to as "main terminal 70." Each of the control terminals 80_1, 80_2, 80_3, and 80_4 is sometimes referred to as "control terminal 80."

Outlines of components of the semiconductor module 10 are first explained sequentially below with reference to FIGS. 1 to 3. In the following explanations, an X axis, a Y axis, and a Z axis orthogonal to each other are properly used for the sake of convenience. The Z axis is parallel to the direction of the thickness of the semiconductor module 10. Hereinafter, one direction along the X axis is an X1 direction, and a direction opposite to the X1 direction is an X2 direction. One direction along the Y axis is a Y1 direction, and a direction opposite to the Y1 direction is a Y2 direction. One direction along the Z axis is a Z1 direction, and a direction opposite to the Z1 direction is a Z2 direction. The relationship between these directions and the vertical direction is not particularly limited and any relationship may be employed. Hereinafter, a view in the direction along the Z axis is sometimes referred to as "plan view."

The wiring substrates 20 illustrated in FIG. 2 are housed in the case 50 and have the semiconductor elements 30 mounted thereto. The wiring substrates 20 and the semiconductor elements 30 together constitute a circuit. For example, a wiring substrate 20 is a substrate, such as a DCB (Direct Copper Bonding) substrate or a DBA (Direct Bonded Aluminum) substrate.

Although not shown, the wiring substrate 20 has an insulating substrate, and two conductive layers respectively provided on both surfaces of the insulating substrate. The insulating substrate is constituted of, for example, a ceramic such as aluminum nitride, aluminum oxide, or silicon nitride. Each of the two conductive layers is constituted of, for example, a metal such as copper or aluminum. One of the two conductive layers (first conductive layer) is a conductive pattern that constitutes a circuit together with the semiconductor elements 30. The semiconductor elements 30 are joined to the first conductive layer with solder or the like. Although not shown, a line such as a bonding wire is properly connected to the first conductive layer. The other one of the two conductive layers (second conductive layer) is joined to the base 40 with solder or the like.

The second conductive layer may be joined to the base 40 by a method other than soldering. The second conductive layer may be configured to function as a radiating substrate. The base 40 may be omitted in this case. While the number of the wiring substrates 20 stacked on the base 40 is two in the example illustrated in FIG. 1, the number is not limited to that in the example illustrated in FIG. 1 and may be one, three, or more.

In the example illustrated in FIG. 2, the direction of thickness of the wiring substrates 20 is along the Z axis. Joined to the respective surfaces facing in the Z1 direction of the wiring substrates 20 are the semiconductor elements 30, and the semiconductor elements 30 are joined by a conductive joining material such as solder. In addition, the base 40 is joined to surfaces facing in the Z2 direction of the wiring substrates 20 by a conductive joining material such as solder.

At least one of the semiconductor elements 30 mounted to the wiring substrates 20 is a power semiconductor chip such as an IGBT. As the semiconductor element 30, a control chip for controlling the operation of the power semiconductor chip may be mounted to the wiring substrates 20 in addition to the power semiconductor chip, or an element such as an FWD (Freewheeling Diode) for commutating a load current may be mounted thereto.

Specifically, the semiconductor elements 30 mounted to the wiring substrates 20 include, for example, two semiconductor elements 30_1 being IGBTs, and two semiconductor elements 30_2 being FWDs as illustrated in FIG. 3.

In the example illustrated in FIG. 3, the two semiconductor elements 30_2 correspond to the two semiconductor elements 30_1, respectively. The cathode of each of the semiconductor elements 30_2 is electrically connected to the collector of the corresponding semiconductor element 30_1, whereas the anode of the semiconductor element 30_2 is electrically connected to the emitter of the corresponding semiconductor element 30_1. The semiconductor element 30_1 and the semiconductor element 30_2 on the upper side in FIG. 3 are elements on a high-potential side and the semiconductor element 30_1 and the semiconductor element 30_2 on the lower side in FIG. 3 are elements on a low-potential side. The emitter of the semiconductor element 30_1 on the high potential side and the collector of the semiconductor element 30_1 on the low-potential side are electrically connected to the main terminal 70_1 and the control terminal 80_3. The collector of the semiconductor element 30_1 on the high-potential side is electrically connected to the main terminal 70_3. The gate of the semiconductor element 30_1 on the high-potential side is electrically connected to the control terminal 80_4. The emitter of the semiconductor element 30_1 on the low-potential side is electrically connected to the main terminal 70_2 and the control terminal 80_2. The gate of the semiconductor element 30_1 on the low-potential side is electrically connected to the control terminal 80_1.

The base 40 illustrated in FIG. 2 is a plate-like member for heat dissipation. For example, the base 40 is a metallic plate constituted of copper, copper alloy, aluminum, or aluminum alloy. The base 40 has a thermal conductivity and radiates heat from the semiconductor elements 30. Furthermore, the base 40 is conductive, and is, for example, electrically connected to a reference potential such as a ground potential.

In the example illustrated in FIG. 2, the direction of thickness of the base 40 is along the Z axis. When viewed in the direction along the Z axis, the base 40 has a shape including one pair of long sides extending in the direction along the X axis and one pair of short sides extending in the direction along the Y axis. Provided on the base 40 are attachment holes 41 adjacent to each of the short sides. An attachment hole 41 is, for example, a through hole used to screw a member for heat dissipation (hereafter, "radiating member"), such as a radiating fin (not shown) onto the base 40. The shape of the base 40 in the plan view is not limited to the example illustrated in FIG. 1 and may be any shape. The attachment hole 41 is provided as required, or may be omitted.

The case 50 is a box-like member that houses the semiconductor elements 30 mounted to the wiring substrates 20. The case 50 is a substantial insulator, which is constituted of, for example, a resin material, such as PPS (polyphenylene sulfide) or PBT (polybutylene terephthalate), and is obtained by injection molding or the like. The resin material may contain inorganic fiber, such as glass fiber or may contain inorganic filler, such as alumina or silica, in view of improvement in mechanical strength or thermal conductivity of the case 50.

The case 50 has a hole 51, two holes 52, and two attachment holes 53. Each of these holes is a hole penetrating through the case 50 in the direction along the Z axis. The hole 51 is a hole in which a nut case 60 is arranged and the three main terminals 70 are inserted. Each of the holes 52 is a hole in which the control terminal unit 12 is inserted. Each of the attachment holes 53 is a through hole used with the attachment holes 41 described above to screw the radiating member, such as the radiating fin (not shown) onto the base 40.

In the example illustrated in FIGS. 1 and 2, the direction of thickness of the case 50 is along the Z axis. The case 50 has an outer shape including one pair of long sides extending in the direction along the X axis and one pair of short sides extending in the direction along the Y axis when viewed in the direction along the Z axis. The two attachment holes 53 are positioned adjacent to the short sides of the case 50 and each overlaps the corresponding one of the two attachment holes 41 described above in plan view. The hole 51 is positioned between the two attachment holes 53 and has a shape extending in the direction along the X axis in the plan view. The two holes 52 are positioned adjacent to either end of one of the short sides of the case 50, and sandwich one of the two attachment holes 53 in the plan view.

The nut case 60 is a structure arranged in the hole 51 described above, to screw the main terminals 70_1, 70_2, and 70_3 onto bus bars (not shown). A plurality of nuts 61 are fixed to the nut case 60. The nut case 60 is constituted of, for example, a resin material, such as PPS (polyphenylene sulfide) or PBT (polybutylene terephthalate), and is obtained by injection molding or the like, similarly to the case 50. The nut case 60 may be formed by insert molding using the nuts 61 as inserted parts.

Each of the three main terminals 70 is a terminal for electrically connecting a bus bar (not shown) and the associated semiconductor element 30 to each other. As described above, each of the three main terminals 70 is electrically connected to the collector or emitter of the associated semiconductor element 30_1 illustrated in FIG. 3. The main terminals 70 are constituted of, for example, a metal, such as copper, copper alloy, aluminum, aluminum alloy, or iron alloy, and are obtained by folding of a metallic plate, or the like.

In the example illustrated in FIGS. 1 and 2, each of the main terminals 70 has an electrode part 71 and two frame parts 72. The electrode part 71 is a portion of the main terminal 70 and is exposed outside the case 50 through the hole 51 described above. The electrode part 71 has a plate shape with the direction of thickness along the Z axis. A hole 73 is provided on the electrode part 71. A screw (not shown) fastened to the nut case 60 is inserted into the hole 73. The electrode part 71 is supported on the associated wiring substrate 20 via the frame parts 72. The electrode part 71 has a first end in the Y1 direction and a second end in the Y2 direction in the planar view. The two frame parts 72 are portions of the main terminal 70 supporting the electrode part 71 and extend from the first and the second ends of the electrode part 71 toward the wiring substrate 20. The frame parts 72 are joined to the wiring substrate 20 by solder or the like.

Each of the four control terminals 80 is a terminal for electrically connecting a substrate (not shown, hereinafter also referred to as "mounting board") having a circuit that controls the operation of the semiconductor module 10 and the associated semiconductor element 30 to each other. As described above, each of the four control terminals 80 is electrically connected to the gate of the associated semiconductor element 30_1 or the anode of the associated semiconductor element 30_2 illustrated in FIG. 3. The control terminals 80 are constituted of, for example, a metal, such as copper, copper alloy, aluminum, aluminum alloy, or iron alloy, and are obtained by folding of a metallic plate.

In the example illustrated in FIGS. 1 and 2, each of the control terminals 80 includes a terminal pin part 81 and a frame part 82. The terminal pin part 81 is a rod-like portion of the control terminal 80 protruding from the outer wall surface of the case 50 through the hole 52 described above and extends in the direction along the Z axis. The terminal pin part 81 is supported on the associated wiring substrate 20 via the frame part 82. The frame part 82 is a portion of the control terminal 80 supporting the terminal pin part 81 and extends from an end in the Z2 direction of the terminal pin part 81 toward the wiring substrate 20. The frame part 82 is joined to the wiring substrate 20 by way of solder or the like. Details of the control terminals 80 will be explained later with reference to FIG. 5 and the like.

Each of the two guide blocks 90 is constituted of a component separate from the case 50 and is a member for positioning a mounting board (not shown) and the associated control terminals 80 at the time of connecting the control terminals 80 to the mounting board. The two guide blocks 90 are constituted of separate components from each other. One of the two guide blocks 90 is fixed integrally to the control terminals 80_1 and 80_2, and the other guide block 90 is fixed integrally to the control terminals 80_3 and 80_4. The guide blocks 90 are, for example, constituted of a resin material, such as PPS (polyphenylene sulfide) or PBT (polybutylene terephthalate), and are obtained by injection molding or the like, similarly to the case 50.

"To be fixed integrally" means, for example, that position and attitude relationships of components are fixed to each other by fitting, insert molding, or bonding in a state in which these components can be regarded as substantially one body. In the present embodiment, a configuration in which the control terminals 80 and the associated guide blocks 90 are fixed integrally by fitting is illustrated as an example.

In the example illustrated in FIGS. 1 and 2, each of the guide blocks 90 has a guide pin part 91 and a support part 92. The guide pin part 91 is a rod-like portion of the guide block 90 protruding from the outer wall surface of the case 50 through the hole 52 described above and extends in the direction along the Z axis. The support part 92 is a portion of the guide block 90 supporting the guide pin part 91 and extends from an end of the guide pin part 91 in the Z2 direction thereof toward the laminated plate 11. The support part 92 is restricted in movement in the direction along the Z axis due to being sandwiched between the case 50 and the laminated plate 11. Details of the guide blocks 90 will be explained later with reference to FIGS. 6 and the like.

In the semiconductor module 10 having the outline described above, the control terminals 80 are fixed integrally to the associated guide blocks 90. Therefore, the position tolerances of the terminal pin part 81 and the guide pin part 91 can be reduced relative to a configuration using guide pins not fixed to the control terminals 80. Accordingly, the semiconductor module 10 that is easy to mount on a mounting board (not shown) can be provided. The control terminal units 12 are explained in detail below.

1-2. Control Terminal Unit

Figure 4:
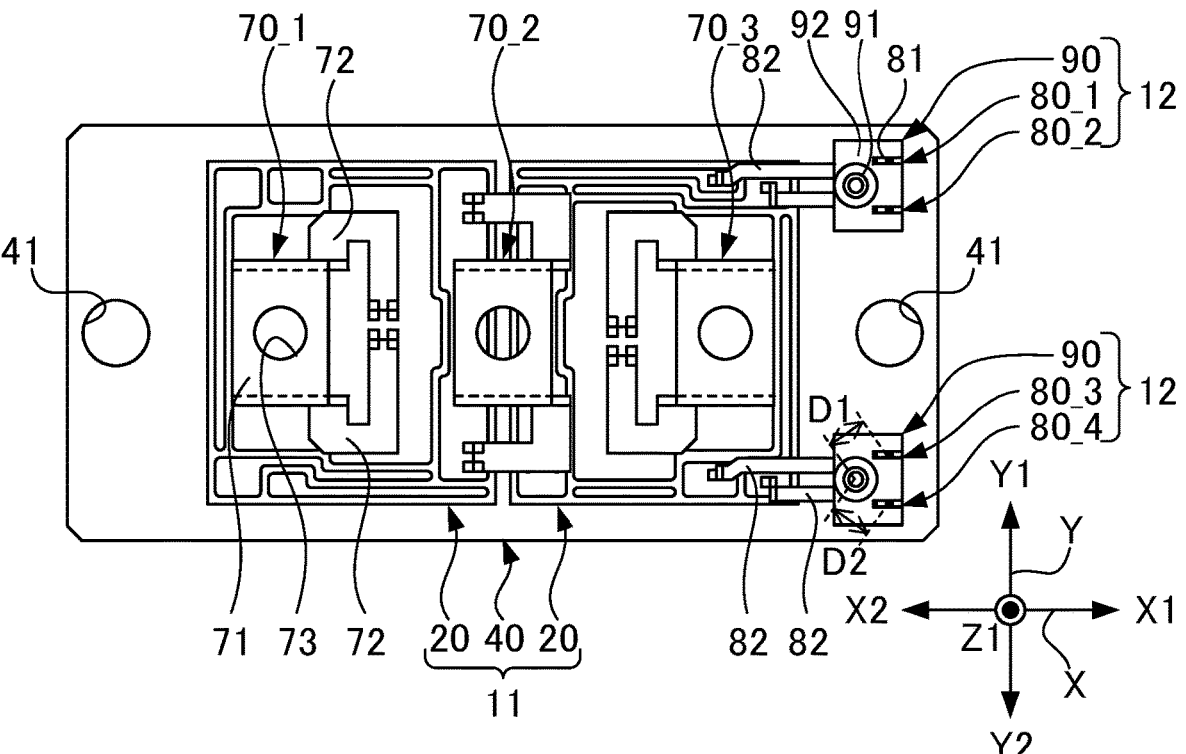
FIG. 4 is a plan view of the semiconductor module from which a case is removed.

FIG. 4 is a plan view of the semiconductor module 10, from which the case 50 is removed. As illustrated in FIG. 4, the two control terminal units 12 are aligned in the direction along the Y axis so as to sandwich one of the two attachment holes 41 in the plan view. That is, the attachment hole 41 is positioned between the two control terminal units 12 adjacent to each other when viewed in the direction of thickness of the laminated plate 11.

One of the two control terminal units 12 is constituted of the control terminals 80_1 and 80_2 and the associated guide block 90, and the other control terminal unit 12 is constituted of the control terminals 80_3 and 80_4 and the associated guide block 90.

Each of the control terminals 80_1, 80_2, 80_3, and 80_4 extends in the direction along the X axis and is arranged from a location overlapping the wiring substrate 20 to a location not overlapping the wiring substrate 20 and overlapping the base 40 in plan view. Each guide block 90 is arranged at a location not overlapping the wiring substrate 20 and overlapping the base 40 in plan view.

In the example illustrated in FIG. 4, the two control terminal units 12 have the same configuration. The control terminal 80_1 and the control terminal 80_3 have the same configuration. The control terminal 80_2 and the control terminal 80_4 have the same configuration. The control terminals 80_1 and 80_3 and the control terminals 80_2 and 80_4 have the same configuration except that the lengths of the frame parts 82 are different from each other. The two control terminal units 12 may have different configurations from each other. The control terminal 80_1 and the control terminal 80_2 may have the same configuration, and the control terminal 80_3 and the control terminal 80_4 may have the same configuration.

In each of the control terminal units 12, a distance D1 between one of the terminal pin parts 81 of the two control terminals 80 and the guide pin part 91 is equal to a distance D2 between the other terminal pin part 81 and the guide pin part 91. That is, in each of the control terminal units 12, the terminal pin parts 81 of the two control terminals 80 are arranged on the same circumference around the central axis of the guide pin part 91 when viewed along the central axis. A situation in which "the distance D1 and the distance D2 are equal to each other" includes a case in which the distances are exactly equal and also a case in which the distances are different but such a difference can be regarded as substantially equal, such as a manufacturing error.

Figure 5:
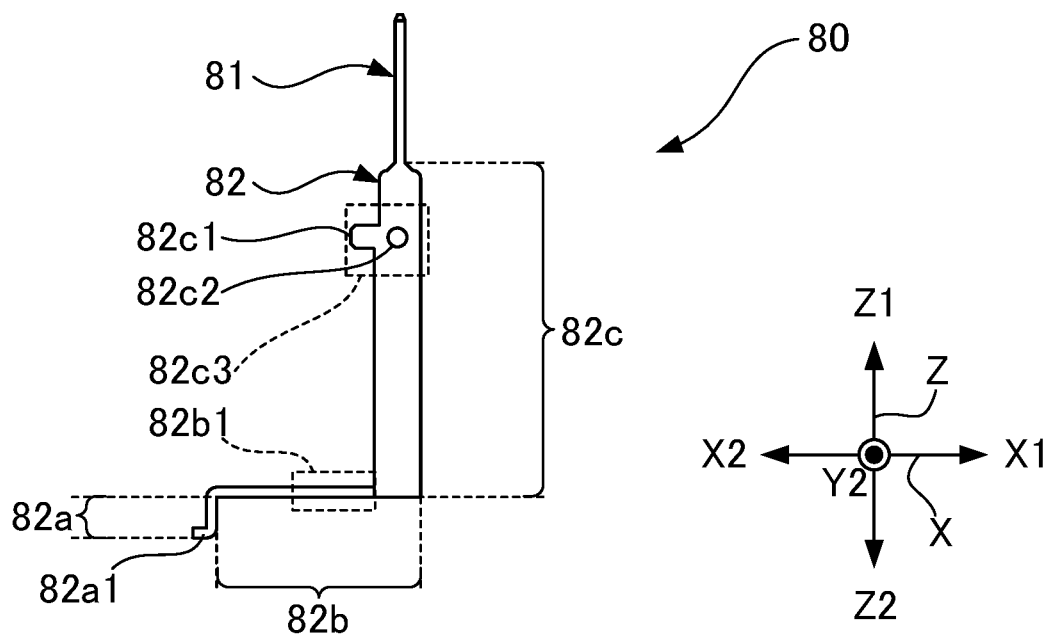
FIG. 5 is a side view of a control terminal.

FIG. 5 is a side view of the control terminal 80. As illustrated in FIG. 5, the frame part 82 of the control terminal 80 has a first portion 82a, a second portion 82b, and a third portion 82c.

The first portion 82a is a portion of the frame part 82 extending in the Z1 direction from the wiring substrate 20. A joining part 82a1 to be joined to the wiring substrate 20 is provided at an end of the first portion 82a in the Z2 direction. In the example illustrated in FIG. 5, a portion of the first portion 82a except for the joining part 82a1 has a plate shape with a direction of thickness along the X axis. The joining part 82a1 has a plate shape with a direction of thickness along the Z axis. The first portion 82a having the shape described above is more likely to cause flexural deformation in the direction along the X axis than in other directions.

The second portion 82b is a portion of the frame part 82 extending in the X1 direction from an end of the first portion 82a in the Z1 direction. The second portion 82b has a portion 82b1 to be fitted into a slit 92e described later of the guide block 90. The portion 82b1 is an example of a "first shape portion." In the example illustrated in FIG. 5, the second portion 82b has a plate shape with a direction of thickness along the Z axis. Accordingly, the second portion 82b is more likely to cause flexural deformation in the direction along the Z axis than in other directions.

The third portion 82c is a portion of the frame part 82 extending in the Z1 direction from an end of the second portion 82b in the X1 direction. The third portion 82c has a portion 82c3 to be fitted into a slit 92d described later of the guide block 90. The portion 82c3 is an example of the "first shape portion." The portion 82c3 has a protruding portion 82c1 protruding in the X2 direction, and a protruding portion 82c2 protruding in the Y2 direction. In the example illustrated in FIG. 5, the third portion 82c has a plate shape with a direction of thickness along the Y axis. Accordingly, the third portion 82c is more likely to cause flexural deformation in the direction along the Y axis than in other directions.

Figure 6:
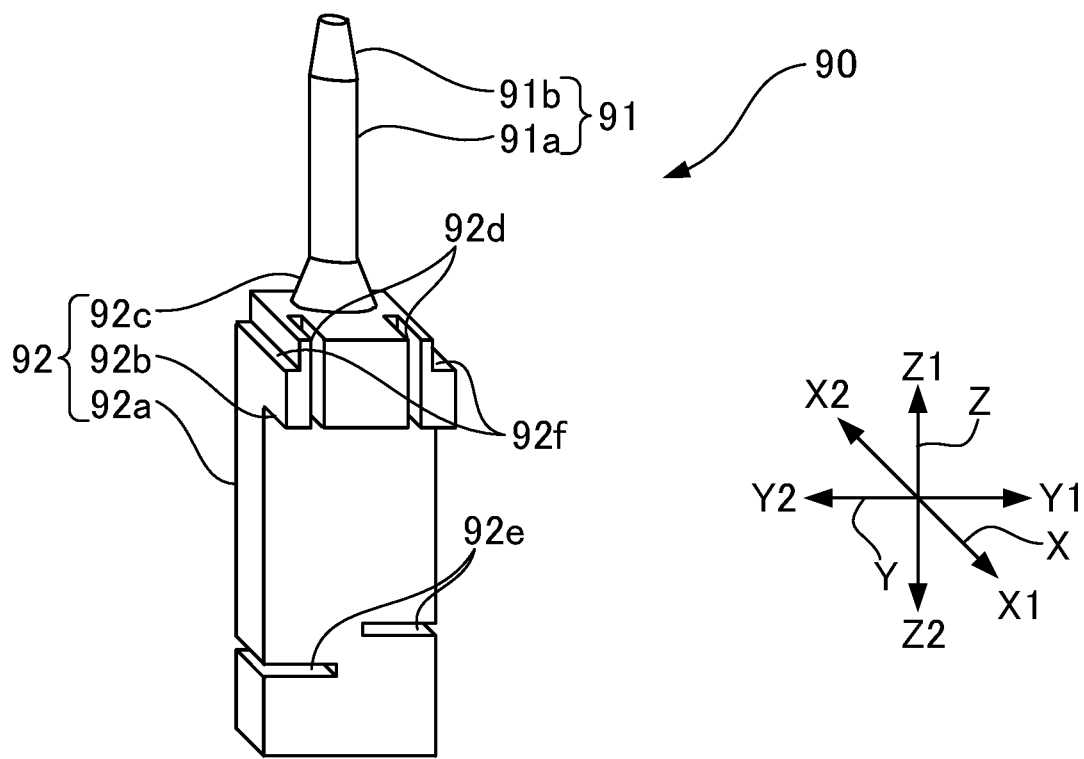
FIG. 6 is a perspective view of a guide block.

FIG. 6 is a perspective view of the guide block 90. As illustrated in FIG. 6, the support part 92 of the guide block 90 has a columnar shape extending in a direction along the Z axis. In detail, the support part 92 has a columnar portion 92a, a wide portion 92b, and a connecting portion 92c. The columnar portion 92a, the wide portion 92b, and the connecting portion 92c are aligned, in this order, in the Z1 direction.

The columnar portion 92a is a portion of the support part 92 extending in the direction along the Z axis. In the example illustrated in FIG. 6, the columnar portion 92a has a schematically quadrangular prism shape. The columnar portion 92a has an outer shape including one pair of short sides along the X axis and one pair of long sides along the Y axis in plan view. A slit 92e open in the X1 direction and the X2 direction are provided on each of a surface of the columnar portion 92a facing in the Y1 direction and a surface thereof facing in the Y2 direction. The slit 92e is an example of "second shape portion" and is fitted with the portion 82b1 of the associated second portion 82b described above. These slits 92e are provided at locations different from each other in the direction along the Z axis. Each of the slits 92e has a shape spreading in a direction orthogonal to the Z axis. The shape of the columnar portion 92a is not limited to the example illustrated in FIG. 6 and may be, for example, a cylindrical shape.

The wide portion 92b is a portion of the support part 92 that is located in the Z1 direction with respect to the columnar portion 92a and that is wider in the direction along the X axis than the columnar portion 92a. The wide portion 92b has a portion protruding from a surface facing in the X1 direction of the columnar portion 92a. In the example illustrated in FIG. 6, the wide portion 92b schematically has an outer shape including one pair of sides along the X axis and one pair of sides along the Y axis in the plan view. Two slits 92d open in the Z1 direction and the Z2 direction are provided on a surface of the wide portion 92b facing in the X1 direction. Each of the slits 92d is an example of "second shape portion" and is fitted with a portion 82c3 of the associated third portion 82c described above. These slits 92d are provided at the same location in the direction along the Z axis. Each of the slits 92d has a shape spreading in a direction orthogonal to the Y axis. Provided on a surface of the wide portion 92b facing in the Z1 direction are stepped portions 92f along the respective two sides along the X axis. The shape of the wide portion 92b is not limited to the example illustrated in FIG. 6 and may be, for example, a shape from which the stepped portions 92f are omitted.

The connecting portion 92c is a portion of the support part 92 protruding from a surface of the wide portion 92b facing in the Z1 direction and connected to an end of the guide pin part 91 in the Z2 direction. In the example illustrated in FIG. 6, the connecting portion 92c has a circular shape in plan view. The width of the connecting portion 92c gradually decreases toward the Z1 direction and matches the width of the guide pin part 91 at an end in the Z1 direction. The shape of the connecting portion 92c is not limited to the example illustrated in FIG. 6 and may be a shape having a constant width or a shape forming a step between the connecting portion 92c and the guide pin part 91. The connecting portion 92c is provided as required, or may be omitted.

The guide pin part 91 has a columnar shape protruding in the Z1 direction from the support part 92. In the example illustrated in FIG. 6, the guide pin part 91 has a shaft portion 91$a$ and a tapered portion 91$b$.

The shaft portion 91$a$ is a portion of the guide pin part 91 extending in the Z1 direction with a constant width from the support part 92. In the example illustrated in FIG. 6, the shaft portion 91$a$ has a cylindrical shape. The tapered portion 91$b$ is a portion of the guide pin part 91 having a width gradually decreasing from an end of the shaft portion 91$a$ in the Z1 direction toward the tip. In the example illustrated in FIG. 6, the tapered portion 91$b$ has a truncated cone shape.

Figure 7:
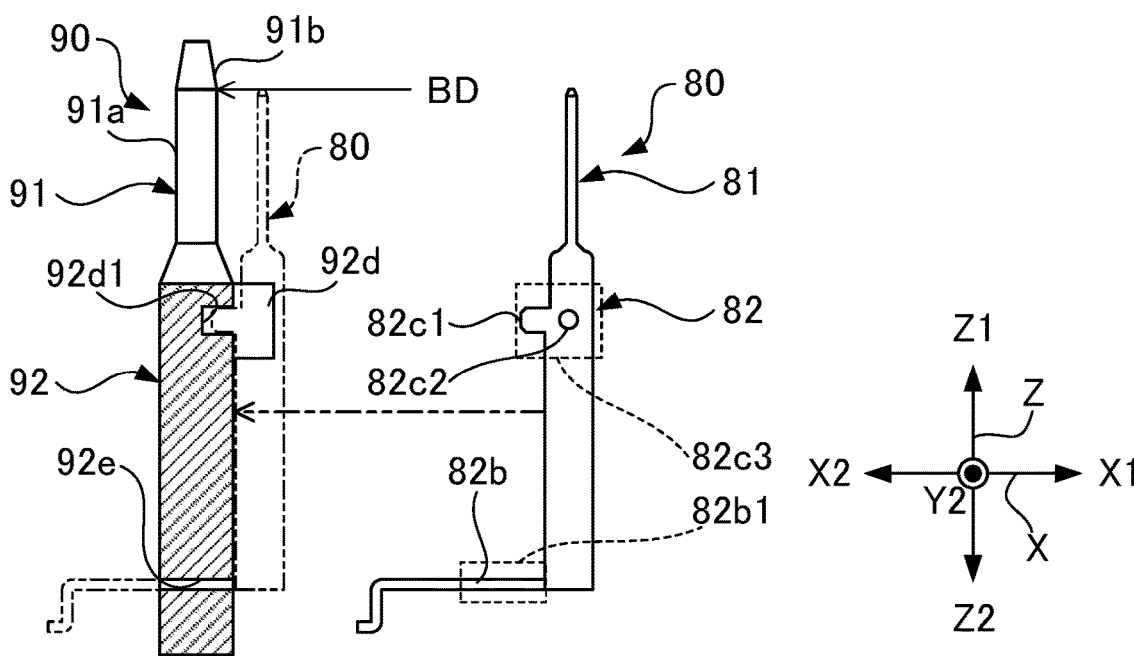
FIG. 7 is an explanatory diagram of fitting of the control terminal to the guide block.

FIG. 7 is an explanatory diagram of fitting of the control terminal 80 to the guide block 90. As illustrated in FIG. 7, the portion 82$c$3 of the control terminal 80 is fitted into the slit 92$d$ of the guide block 90. In the example illustrated in FIG. 7, a concave portion 92$d$1 having a shape corresponding to the protruding portion 82$c$1 is provided on the slit 92$d$. This configuration restricts movement of the control terminal 80 along the Z axis with respect to the guide block 90.

The portion 82$b$1 of the control terminal 80 is fitted into the slit 92$e$ of the guide block 90. Accordingly, the movement of the control terminal 80 along the Z axis with respect to the guide block 90 is also restricted in this respect. The fitting of the control terminal 80 to the guide block 90 at two locations can also reduce an attitude change of the control terminal 80 with respect to the guide block 90.

A boundary BD between the shaft portion 91$a$ and the tapered portion 91$b$ is at a first location substantially coincident with the tip of the terminal pin part 81 of the control terminal 80 along the Z axis or at a second location further in the Z1 direction relative to the first location. Accordingly, at the time of mounting the semiconductor module 10 on a mounting board (not shown), the terminal pin parts 81 can be inserted into holes for the terminal pin parts 81 of the mounting board, in a state in which positioning between the mounting board and the semiconductor module 10 using the guide pin parts 91 is completed.

Figure 8:
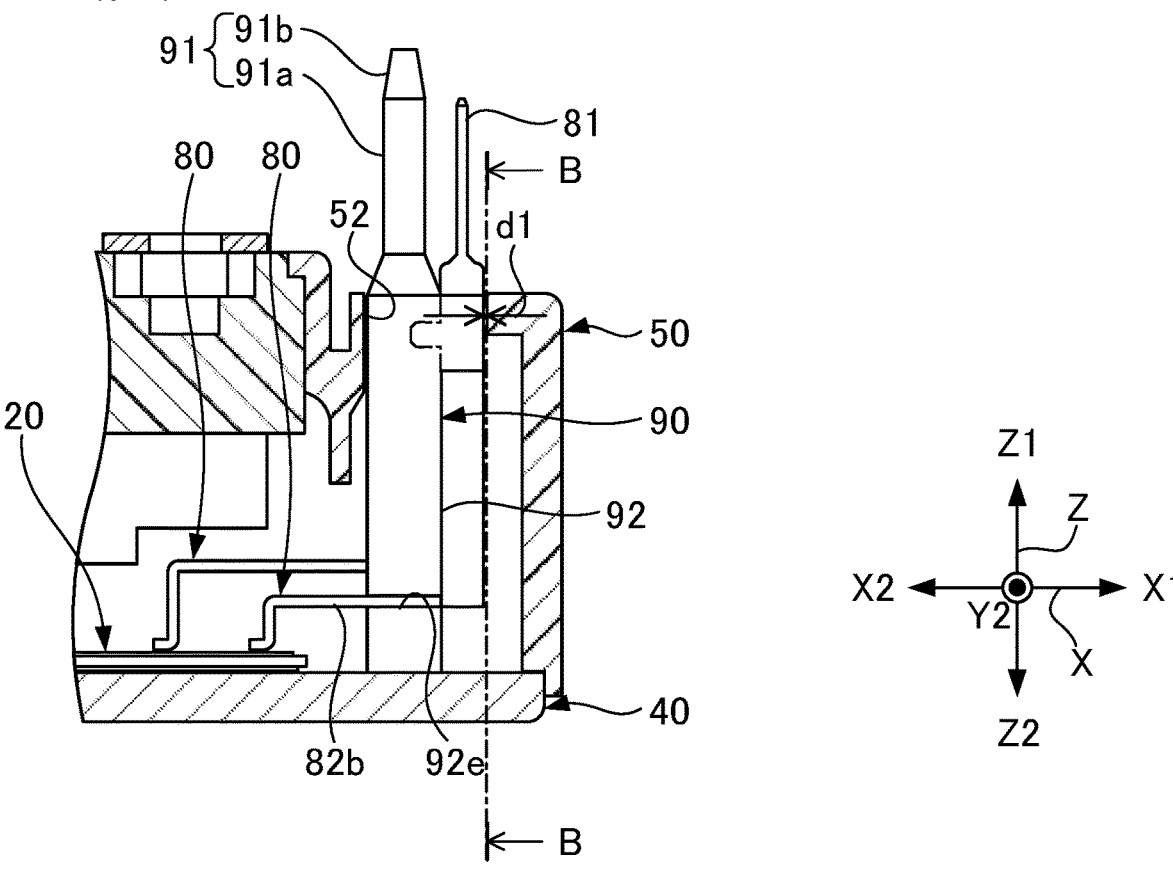
FIG. 8 is a partially enlarged sectional view of the semiconductor module according to the first embodiment.
Figure 9:
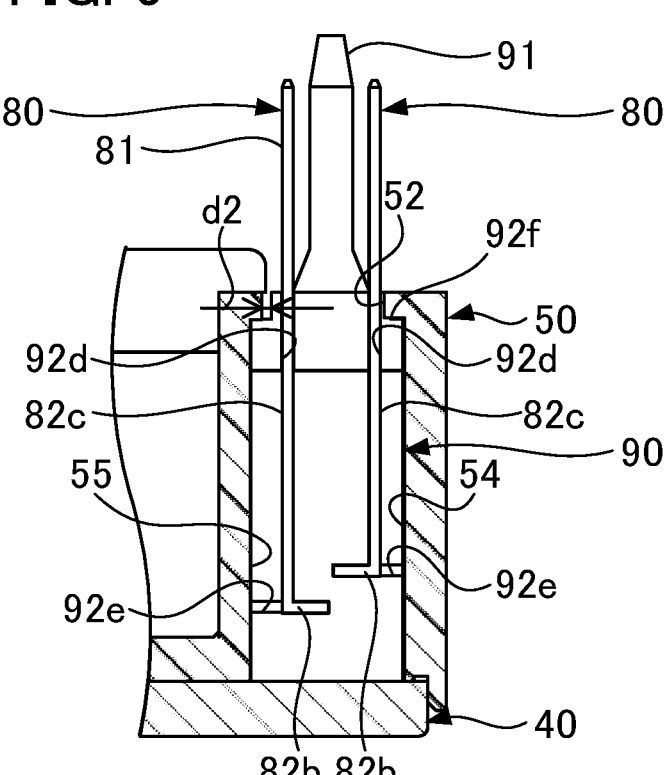
FIG. 9 is a sectional view along line B-B in FIG. 8.
Figure 9:
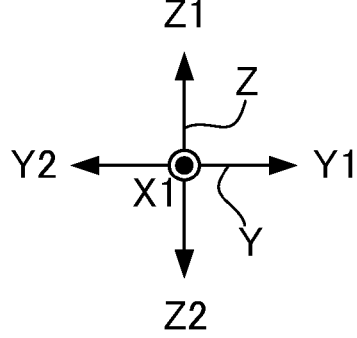

FIG. 8 is a partially enlarged sectional view of the semiconductor module 10 according to the first embodiment. FIG. 9 is a sectional view along line B-B in FIG. 8. As illustrated in FIGS. 8 and 9, each of the guide blocks 90 is inserted into the associated hole 52 of the case 50 together with the two control terminals 80.

The guide blocks 90 are not joined to the base 40 and the case 50. Therefore, changes in the position and the attitude of the guide blocks 90 with respect to the base 40 and the case 50 as described above are allowed.

As illustrated in FIG. 8, a slight gap d1 along the X axis is provided between the inner circumferential surface of each of the holes 52 and the outer circumferential surface of the associated guide block 90. Although not particularly limited, the size of the gap d1 is preferably equal to or smaller than a gap d2 described later. If the gap d1 is too large, excessive stress may occur at joining portions between the control terminals 80 and the wiring substrate 20 in association with a change in the position or attitude of the guide block 90. On the other hand, when the gap d1 is too small, the control terminal units 12 are difficult to insert into the holes 52.

As illustrated in FIG. 9, the slight gap d2 along the Y axis is provided between the inner circumferential surface of each of the holes 52 and the outer circumferential surface of the associated guide block 90. Although not particularly limited, the size of the gap d2 is about the size corresponding to the position tolerance of holes, provided for the guide pin parts 91 on a mounting board to which the semiconductor module 10 is to be mounted and is, for example, not less than 0.1 millimeter and not more than 1 millimeter. Accordingly, movement of the guide block 90 along the Y axis with respect to the case 50 is allowed in the range of the gap d2. If the gap d2 is too large, excessive stress may occur at the joining portions between the control terminals 80 and the wiring substrate 20 in association with a change in the position or attitude of the guide block 90. On the other hand, depending on the position tolerance of the holes provided for the guide pin parts 91 on a mounting board to which the semiconductor module 10 is to be mounted, the semiconductor module 10 is likely to become difficult to mount to a mounting board if the gap d2 is too small, as in a case in which the guide blocks 90 are formed integrally with the case 50.

The stepped portions 92$f$ of the support part 92 of each of the guide blocks 90 are brought to contact with an end of the associated hole 52 in the Z2 direction. Accordingly, the support part 92 is sandwiched between the case 50 and the base 40. The case 50 has a surface 54 opposing a surface of the support part 92 facing in the Y1 direction, and a surface 55 opposing a surface of the support part 92 facing in the Y2 direction, as illustrated in FIG. 9. These surfaces 54 and 55 restrict an attitude change of the guide block 90 around the X axis with respect to the case 50. A gap similar to the gap d2 described above is provided between each of these surfaces and the support part 92. The stepped portions 92$f$ are provided as required, or may be omitted.

As described, a semiconductor module 10 includes semiconductor elements 30, a case 50, and a plurality of control terminal units 12. The case 50 houses the semiconductor elements 30. Each of the control terminal units 12 has at least one control terminal 80 and a guide block 90. The control terminal 80 has the terminal pin part 81 protruding from the outer wall surface of the case 50 and is electrically connected to the associated semiconductor element 30. The guide block 90 has a guide pin part 91 protruding from the outer wall surface of the case 50 in a direction the same as the direction in which the terminal pin part 81 protrudes, is constituted of a separate component from the case 50, and is fixed integrally to the at least one control terminal 80. The respective guide blocks 90 of the plurality of control terminal units 12 are constituted of separate components.

Since the control terminal 80 is fixed integrally to the guide block 90 in the semiconductor module 10, the position tolerances of the terminal pin part 81 and the guide pin part 91 can be decreased compared with a configuration using guide pins that are not fixed to the control terminal 80.

Since the guide blocks 90 are separate components from the case, the control terminals 80 can be easily electrically connected to the semiconductor elements 30 before the case 50 is fixed to the laminated plate 11.

Since the guide blocks 90 of the plurality of control terminal units 12 are constituted of separate components, a configuration that allows a change in the position or attitude of the guide blocks 90 with respect to the case 50 can be employed. Accordingly, in a case of mounting the semiconductor module 10 to a mounting board having two holes in which the two guide pin parts 91 are to be inserted, the semiconductor module 10 can be easily mounted to the mounting board while the position tolerances of the terminal pin parts 81 and the guide pin parts 91 are maintained even when the distance between these two holes is slightly different from the distance between these two guide pin parts 91.

Furthermore, since the guide blocks 90 of the control terminal units 12 are constituted of separate components from each other, the guide blocks 90 or the control terminal units 12 can also be used in a different semiconductor module 10 having a different distance between the two guide pin parts 91. This configuration allows for reduction in cost of the semiconductor module 10. The guide blocks 90 with the same configuration can be used among the plurality of control terminal units 12. Therefore, the cost of the semiconductor module 10 can also be reduced as compared to a case in which the guide blocks 90 with different configurations are used in the control terminal units 12.

As described above, each of the at least one control terminal 80 has plate-like portions 82*b*1 and 82*c*3 being examples of the "first shape portion." In addition, each of the guide blocks 90 has slits 92*d* and 92*e* (slit-like portions) being examples of the "second shape portion." Each of the slits 92*d* is fitted with the portion 82*c*3. Each of the slits 92*e* is fitted with the portion 82*b*1. Accordingly, each of the control terminals 80 and the associated guide block 90 can be fixed integrally with each other without using an adhesive. Since no expensive mold as in insert molding is required, the cost of the semiconductor module 10 can be reduced relative to a configuration using the insert molding. Furthermore, since a control terminal 80 to be used for each of the guide blocks 90 can be appropriately selected from different types of control terminals 80 after the guide blocks 90 are molded, the guide block 90 can be made the same for plural types of semiconductor modules 10. Therefore, the cost of the semiconductor module 10 can be reduced also in this respect.

As described above, the semiconductor module 10 further includes a laminated plate 11. The laminated plate 11 includes a wiring substrate 20 that has the semiconductor elements 30 mounted thereto and that is housed in the case 50. The at least one control terminal 80 further includes a frame part 82. The terminal pin part 81 is supported on the wiring substrate 20 via the frame part 82. Accordingly, the control terminal 80 can be electrically connected to the associated semiconductor element 30 while the position and attitude of each of the control terminal units 12 with respect to the laminated plate 11 are restricted in a predetermined range. In the configuration using the control terminal 80, the control terminal 80 needs to be connected to the wiring substrate 20 before the case 50 is fixed to the laminated plate 11. Therefore, the guide block 90 integrated with the control terminal 80 being a separate component from that of the case 50 as described above is also useful for assembling the semiconductor module 10.

As described above, the frame part 82 includes a first portion 82*a*, a second portion 82*b*, and a third portion 82*c*. The first portion 82*a* is joined to the wiring substrate 20 and extends along a direction away from the wiring substrate 20. The second portion 82*b* extends along a direction intersecting with the direction of thickness of the wiring substrate 20 from the first portion 82*a*. The third portion 82*c* extends along the direction of thickness of the wiring substrate 20 from the second portion 82*b*. The associated guide block 90 is fixed integrally to the third portion 82*c*. Accordingly, even when the distance between the wiring substrate 20 and the guide pin part 91 is large, the terminal pin part 81 can be arranged near the guide pin part 91.

As described above, the second portion 82*b* has a plate shape having a direction of thickness along the direction of thickness of the wiring substrate 20. The third portion 82*c* has a plate shape having a direction of thickness along the direction in which the control terminal units 12 are aligned. Accordingly, changes in the positions and attitudes of the terminal pin part 81 and the guide pin part 91 are allowed.

Furthermore, as described above, the guide block 90 further includes a support part 92 to be fixed integrally to the third portion 82*c* of the at least one control terminal 80. The guide pin part 91 protrudes from the support part 92. Accordingly, the guide block 90 can be more easily positioned with respect to the case 50 compared with a configuration not including the support part 92.

As described above, the third portion 82*c* has a protruding part 82*c*1 protruding in a direction intersecting with the direction in which the third portion 82*c* extends. In addition, the support part 92 has a concave portion 92*d*1 fitted with the protruding part 82*c*1. Therefore, the control terminal 80 can be easily fitted with the associated guide block 90 while allowing a deformation in the direction of thickness of the second portion 82*b*.

As described above, the support part 92 has slits 92*e* to be fitted with the second portions 82*b*. Therefore, each of the control terminals 80 is fitted with the associated guide block 90 at two locations including the second portion 82*b* and the third portion 82*c*, so that the terminal pin part 81 and the guide pin part 91 can prevent changes in the positions and attitudes.

As described above, the support part 92 has a columnar shape. Therefore, the entire guide block 90 has a columnar shape and the installation space for the guide block 90 can be reduced. As a result, an increase in size of the semiconductor module 10 can be avoided.

Furthermore, as described above, the support part 92 is sandwiched between the case 50 and the laminated plate 11. Therefore, movement in the direction along the central axis of the guide pin part 91 can be restricted. Since a configuration to fit a resin block to a resin case as described in WO 2016/163237 is not required, the configuration of the semiconductor module 10 can be simplified.

As described above, the laminated plate 11 has an attachment hole 41 used for attachment of a heatsink 130. The case 50 has an attachment hole 53 used for attachment of the heatsink 130. The attachment holes 41 and 53 are positioned between two control terminal units 12 adjacent to each other when viewed in the direction of thickness of the laminated plate 11. Accordingly, the attachment holes 41 and 53 can be arranged at locations accessible even in a state in which the semiconductor module 10 is connected to a bus bar 110 while reducing the size of the semiconductor module 10.

As described above, the case 50 has a plurality of holes 52 each provided for each of the guide blocks 90. The associated guide block 90 is inserted into each of the holes 52. In addition, gaps d1 and d2 are provided between the inner circumferential surfaces of each of the holes 52 and the outer circumferential surface of the associated guide block 90. This configuration allows changes in the position and the attitude of the guide pin part 91 with respect to the case 50.

As described above, two control terminals 80 are fixed integrally to one guide block 90. The respective terminal pin parts 81 of the two control terminals 80 are arranged on the same circumference around the central axis of the guide pin part 91 when viewed in the direction along the central axis. Therefore, the number of guide blocks 90 can be decreased compared with a configuration in which one control terminal is integrated with one guide block 90. As a result, the cost of the semiconductor module 10 can be reduced. Furthermore, there is an advantage in that a difference between the position tolerances of the two terminal pin parts 81 can be easily reduced by the arrangement of the terminal pin parts 81 of the two control terminals 80 on the same circumference around the central axis of the guide pin part 91 when viewed along the central axis.

2. Second Embodiment

A second embodiment of the present disclosure is explained below. For elements for which effects and functions in the embodiments exemplified below are identical to those in the embodiment described above, reference signs used for explaining the embodiment described above are used, and detailed explanations thereof are omitted as appropriate.

Figures 10, 11:
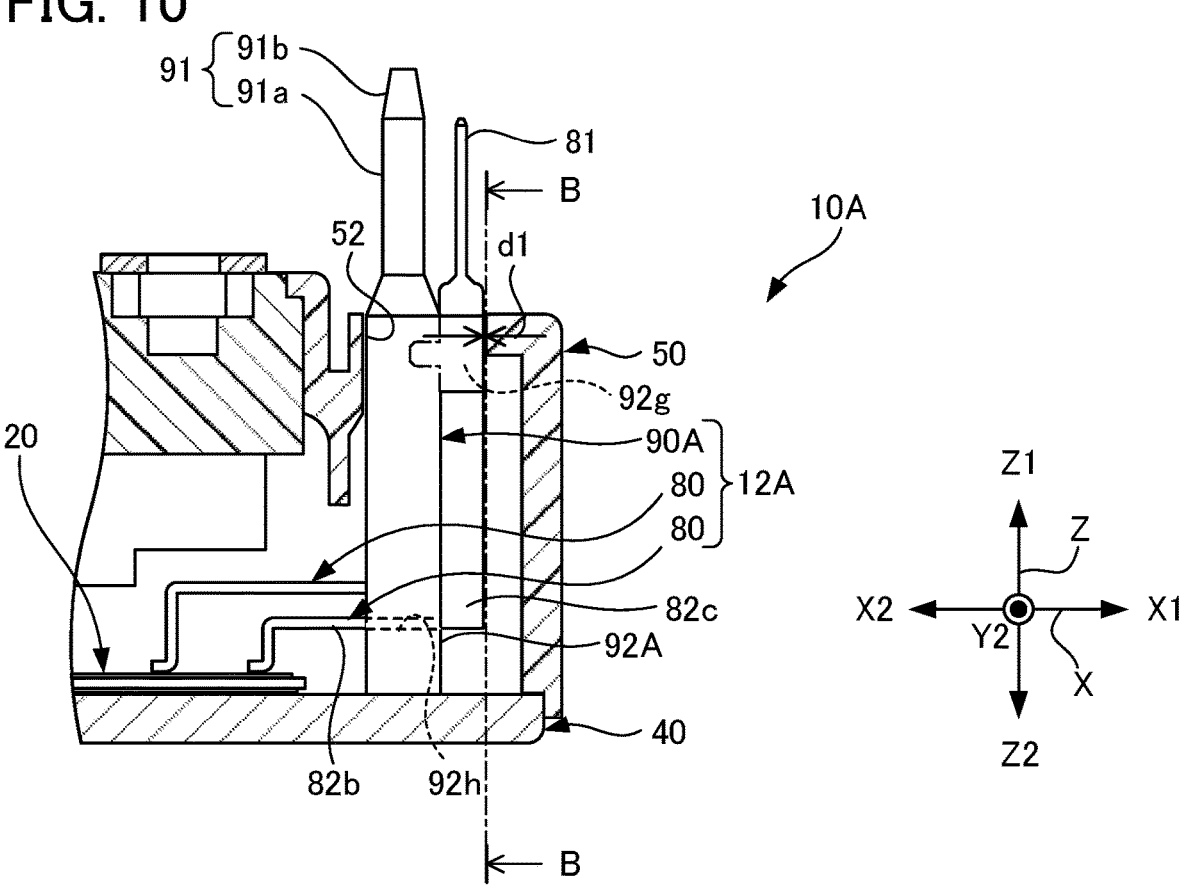
FIG. 10 is a partially enlarged sectional view of a semiconductor module according to a second embodiment.
FIG. 11 is a sectional view along line B-B in FIG. 10.

FIG. 10 is a partially enlarged sectional view of a semiconductor module 10A according to the second embodiment. FIG. 11 is a sectional view along line B-B in FIG. 10. The semiconductor module 10A is configured similarly to the semiconductor module 10 according to the first embodiment described above except for including control terminal units 12A instead of the control terminal units 12. The control terminal units 12A are configured similarly to the control terminal units 12, except for including guide blocks 90A instead of the guide blocks 90. The guide blocks 90A are configured similarly to the guide blocks 90 except for being integrally molded along with the control terminals 80 by insert molding using the control terminals 80 as inserted parts.

Each of the guide blocks 90A is configured similarly to the guide block 90, except for having a support part 92A instead of the support part 92. The support part 92A is configured similarly to the support part 92 except for having two joining parts 92g and two joining parts 92h instead of the two slits 92d and the two slits 92e.

As illustrated in FIGS. 10 and 11, each of the two joining parts 92g is joined to a portion of the third portion 82c of the associated control terminal 80 by insert molding. Each of the two joining parts 92h is joined to a part of the second portion 82b of the associated control terminal 80 by insert molding. In the example illustrated in FIGS. 10 and 11, the third portion 82c has a portion exposed from the guide block 90A. The shape of the guide blocks 90A is not limited to the example illustrated in FIGS. 10 and 11 and may be, for example, a shape covering the entire third portion 82c.

Also according to the second embodiment described above, the semiconductor module 10A can be easily mounted to a mounting board. In the present embodiment, at least one control terminal 80 and the guide block 90A comprise an integrally molded part as described above. Accordingly, the control terminal 80 and the guide block 90A can be fixed integrally to each other without using an adhesive. Furthermore, the position tolerances of the terminal pin part 81 and the guide pin part 91 can be decreased relative to a configuration in which fitting or bonding is used.

3. Application Example

Figure 12:
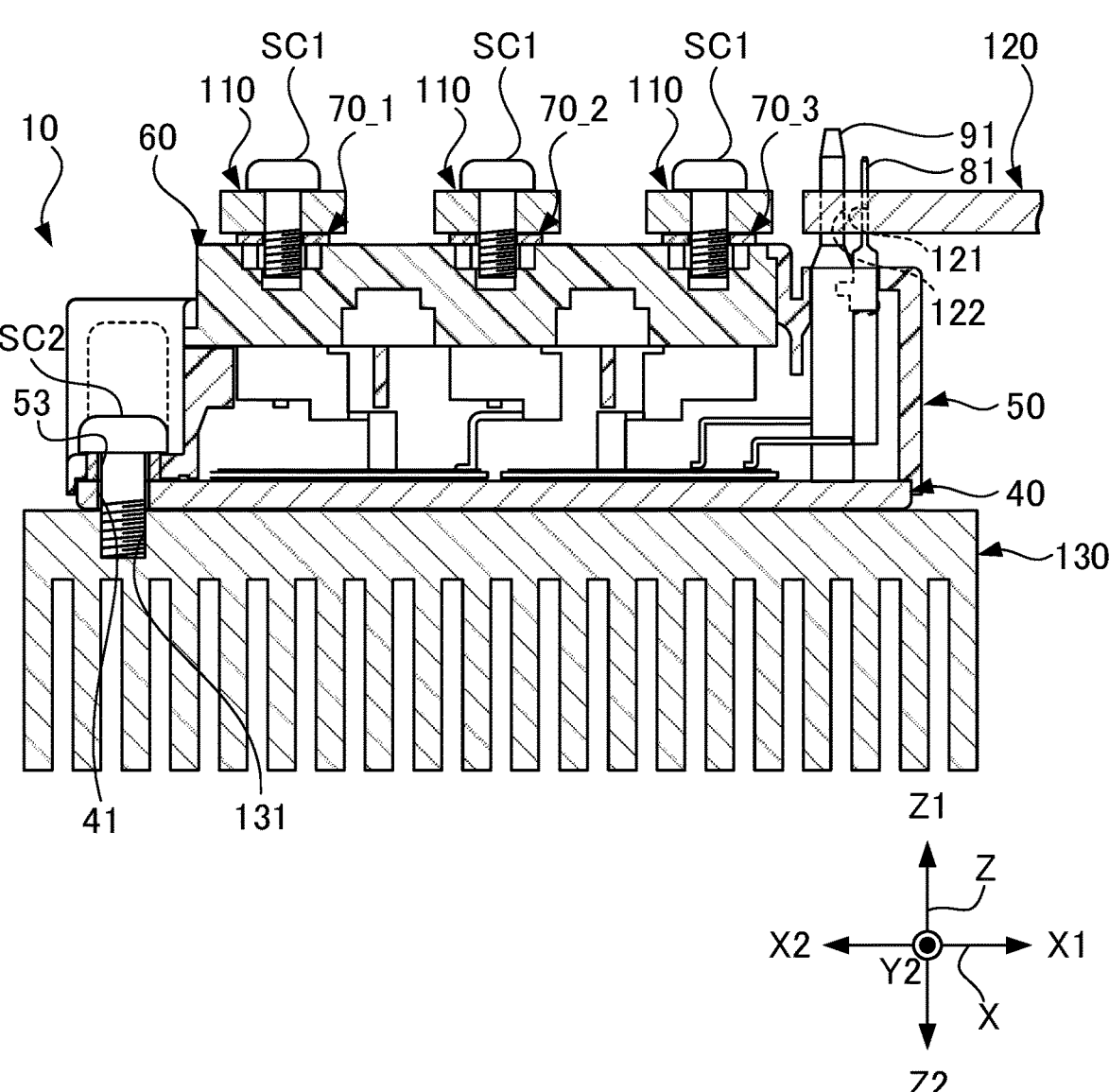
FIG. 12 is a sectional view illustrating an application example of the semiconductor module.

FIG. 12 is a sectional view illustrating an application example of the semiconductor module 10. FIG. 12 illustrates the semiconductor module 10 mounted to a plurality of bus bars 110 and a substrate 120, and having a heatsink 130 attached thereto. Matters described below also hold true for a case using the semiconductor module 10A instead of the semiconductor module 10.

Each of the bus bars 110 is a rod-like conductor for transmitting a large current and is constituted of, for example, a metal, such as copper or aluminum. In the example illustrated in FIG. 12, each of the bus bars 110 extends along the Y axis. The bus bars 110 are arranged along the X axis parallelly to each other so as to correspond to the main terminals 70_1, 70_2, and 70_3, respectively. The corresponding bus bars 110 are connected to the main terminals 70_1, 70_2, and 70_3, respectively. Each of the bus bars 110 is screwed to the nut case 60 with a screw SC1.

The substrate 120 is a mounting board having circuits for controlling the operation of the semiconductor module 10. Four holes 121 and two holes 122 are provided on the substrate 120. The terminal pin part 81 is inserted into each of the holes 121. The guide pin part 91 is inserted into each of the holes 122.

The heatsink 130 is a member for dissipating heat of the semiconductor module 10. The heatsink 130 is constituted of, for example, copper, aluminum, or alloy including either thereof. In the example illustrated in FIG. 12, the heatsink 130 has a shape with a plurality of fins. Two screw holes 131 respectively corresponding to the two attachment holes 41 or the two attachment holes 53 are provided on the heatsink 130. The heatsink 130 is attached to the semiconductor module 10 by fastening screws SC2 inserted into the attachment holes 41 and 53 to the screw holes 131.

Figure 13:
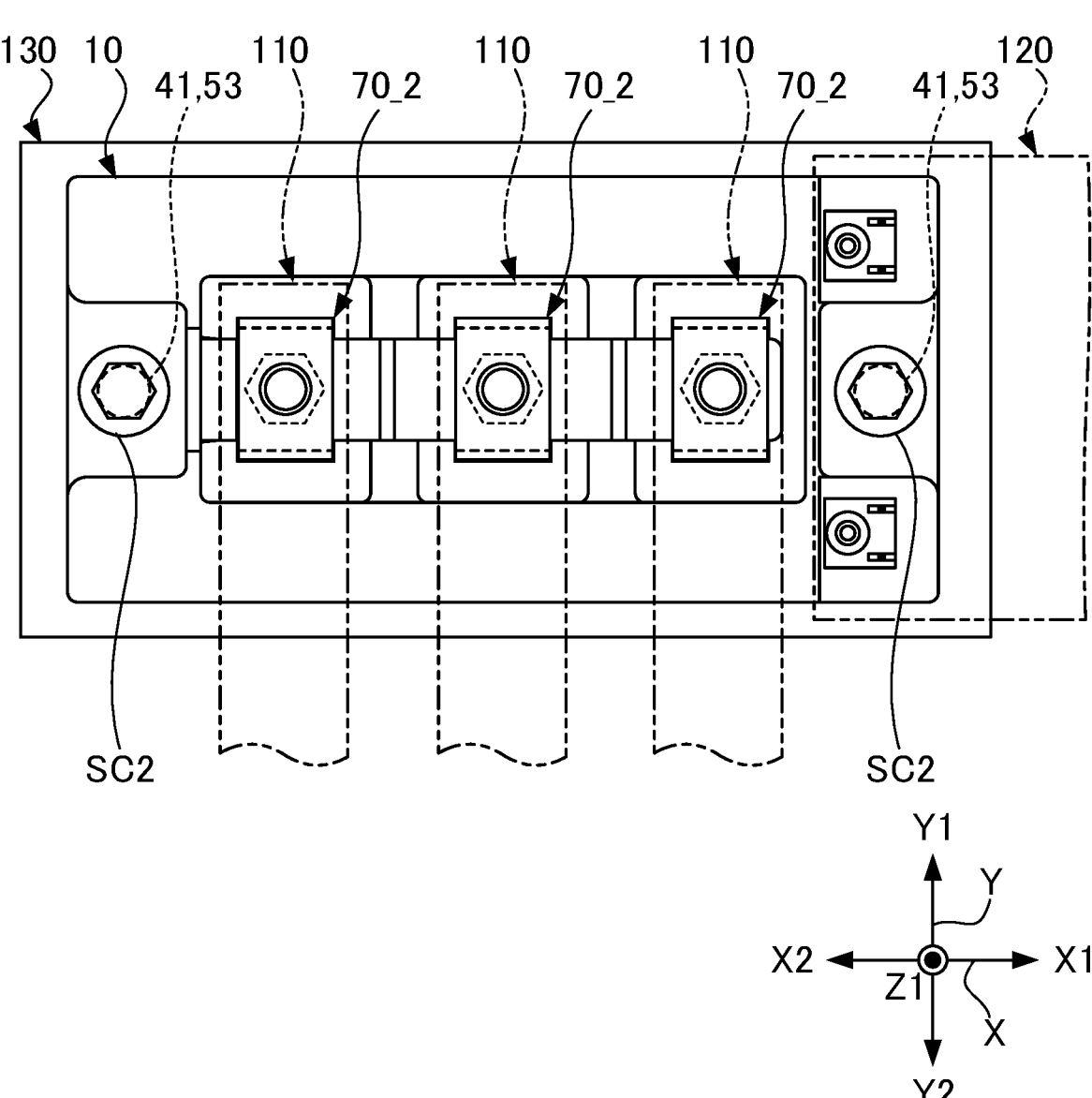
FIG. 13 is a plan view for explaining arrangement of the semiconductor module, bus bars, a substrate, and a heatsink.

FIG. 13 is a plan view for explaining arrangement of the semiconductor module 10, the bus bars 110 and the substrate 120, and the heatsink 130. In FIG. 13, the bus bars 110 and the substrate 120 are indicated by two-dot chain lines, respectively, for convenience sake. As illustrated in FIG. 13, the attachment holes 41 and 53 do not overlap with the bus bars 110 in plan view. Accordingly, even after the semiconductor module 10 is connected to the bus bars 110, the heatsink 130 can be attached to the semiconductor module 10.

4. Modifications

The present disclosure is not limited to the respective embodiments described above, and various modifications described below can be made.

The respective embodiments and the respective modifications may be combined with one another as appropriate.

4-1. First Modification

While a configuration in which each of the control terminals 80 is fixed to the associated guide block 90 or 90A at two points is illustrated in the embodiments described above, the number of fixing locations is not limited to that in this configuration, and it may be one, three, or more. The number of the control terminals 80 integrated with one guide block 90 or 90A is not limited to two, and it may be one, three, or more.

4-2. Second Modification

In the first embodiment described above, it suffices that the control terminals 80 and the associated guide block 90 are integrated by being fitted with each other. The manner of the fitting is not limited to that described above and may be, for example, snap fitting.

4-3. Third Modification

While the configuration in which the support part 92 or the support part 92A is sandwiched between the base 40 and the case 50 is illustrated in the respective embodiments described above, the configuration is not limited to that illustrated, and for example, the support part 92 or the support part 92A may not be in contact with the base 40. In this case, for example, the case 50 may be provided with a configuration for restricting movement of the support part 92 or the support part 92A in the direction along the Z axis. The support part 92 or the support part 92A may be provided as appropriate, or may be omitted.

4-4. Fourth Modification

The shape of the control terminals 80 is not limited to that described above. For example, a portion of the frame part 82 may have a meandering shape, or the shape may have a plurality of portions different in width, or may have a plurality of branched portions. The directions in which the first portion 82a, the second portion 82b, and the third portion 82c respectively extend are not limited to those described above and may be, for example, directions oblique to those described above, respectively.

While IGBTs are illustrated as an example of the semiconductor elements in the respective embodiments described above, the type or configuration of the semiconductor elements is not limited to that illustrated. For example, MOSFETs (Metal-Oxide-Semiconductor Field-Effect Transistors) may be used as the semiconductor elements. In a mode in which the semiconductor elements are MOSFETs, the collector is one of the source electrode and the drain electrode, and the emitter is the other one of the source electrode and the drain electrode. Furthermore, RC-IGBTs (Reverse Conducting IGBTs) including IGBTs and FWDs (Free Wheeling Diodes) may be used as semiconductor elements.

DESCRIPTION OF REFERENCE SIGNS

10 . . . semiconductor module, 10A . . . semiconductor module, 11 . . . laminated plate, 12 . . . control terminal unit, 12A . . . control terminal unit, 20 . . . wiring substrate, 30 . . . semiconductor element, 30_1 . . . semiconductor element, 30_2 . . . semiconductor element, 40 . . . base, 41 . . . attachment hole, 50 . . . case, 51 . . . hole, 52 . . . hole, 53 . . . attachment hole, 54 . . . surface, 55 . . . surface, 60 . . . nut case, 61 . . . nut, 70 . . . main terminal, 70_1 . . . main terminal, 70_2 . . . main terminal, 70_3 . . . main terminal, 71 . . . electrode part, 72 . . . frame part, 73 . . . hole, 80 . . . control terminal, 80_1 . . . control terminal, 80_2 . . . control terminal, 80_3 . . . control terminal, 80_4 . . . control terminal, 81 . . . terminal pin part, 82 . . . frame part, 82a . . . first portion, 82a1 . . . joining part, 82b . . . second portion, 82b1 . . . portion (first shape portion), 82c . . . third portion, 82c1 . . . protruding portion, 82c2 . . . protruding portion, 82c3 . . . portion (first shape portion), 90 . . . guide block, 90A . . . guide block, 91 . . . guide pin part, 91a . . . shaft portion, 91b . . . tapered portion, 92 . . . support part, 92A . . . support part, 92a . . . columnar portion, 92b . . . wide portion, 92c . . . connecting portion, 92d . . . slit (second shape portion), 92d1 . . . concave portion, 92e . . . slit (second shape portion), 92f . . . stepped portion, 92g . . . joining part, 92h . . . joining part, 110 . . . bus bar, 120 . . . substrate, 121 . . . hole, 122 . . . hole, 130 . . . heatsink, 131 . . . screw hole, BD . . . boundary, D1 . . . distance, D2 . . . distance, SC1 . . . screw, SC2 . . . screw, d1 . . . gap, d2 . . . gap.

What is claimed is:

1. A semiconductor module comprising:
a semiconductor element;
a case configured to house the semiconductor element;
a plurality of control terminal units each including at least one control terminal electrically connected to the semiconductor element, and a guide block constituted of a separate component from the case and fixed integrally with the at least one control terminal; and
a laminated plate including a wiring substrate, the wiring substrate having the semiconductor element mounted thereto and housed in the case, wherein:
the at least one control terminal includes:
a frame part including:
a first portion joined to the wiring substrate and that extends along a direction away from the wiring substrate

16 a second portion that extends from the first portion along a direction intersecting with a direction of thickness of the wiring substrate, and
a third portion that extends from the second portion along the direction of thickness of the wiring substrate,
a terminal pin part that protrudes from an outer wall surface of the case and is supported on the wiring substrate via the frame part,
the guide block is fixed integrally with the third portion, and includes:
a support part fixed integrally with the third portion, and
a guide pin part that protrudes from the outer wall surface of the case in a direction in which the terminal pin part protrudes, and that protrudes from the support part.

2. The semiconductor module according to claim 1, wherein
the at least one control terminal has a first shape portion, and
the guide block has a second shape portion fitted with the first shape portion.

3. The semiconductor module according to claim 2, wherein
the first shape portion has a plate shape, and
the second shape portion has a slit shape sandwiching the first shape portion in a direction of thickness of the first shape portion.

4. The semiconductor module according to claim 1, wherein:
the third portion includes a protruding portion protruding in a direction intersecting with a direction in which the third portion extends, and
the support part includes a concave portion fitted with the protruding portion.

5. The semiconductor module according to claim 1, wherein the support part includes a concave portion fitted with the second portion.

6. The semiconductor module according to claim 1, wherein the support part has a columnar shape.

7. The semiconductor module according to claim 1, wherein the support part is sandwiched between the case and the laminated plate.

8. The semiconductor module according to claim 1, wherein:
the laminated plate or the case has an attachment hole used for attachment of a heatsink, and
the attachment hole is positioned between two control terminal units adjacent to each other among the plurality of control terminal units when viewed in a direction of thickness of the laminated plate.

9. A semiconductor module comprising:
a semiconductor element;
a case configured to house the semiconductor element; and
a plurality of control terminal units each including at least one control terminal electrically connected to the semiconductor element, and a guide block constituted of a separate component from the case and fixed integrally with the at least one control terminal,
wherein:
the at least one control terminal includes a terminal pin part that protrudes from an outer wall surface of the case, the guide block includes a guide pin part that protrudes from the outer wall surface of the case in a direction in which the terminal pin part protrudes, the guide block is among a plurality of guide blocks, the case includes a plurality of holes respectively corresponding to the plurality of guide blocks, each guide block among the plurality of guide blocks is inserted into a respectively corresponding hole of the plurality of holes, and a gap is between an inner circumferential surface of each hole of the plurality of holes and an outer circumferential surface of a respectively corresponding guide block of the plurality of guide blocks.

10. A semiconductor module comprising:

a semiconductor element;

a case configured to house the semiconductor element; and a plurality of control terminal units each including at least one control terminal electrically connected to the semiconductor element, and a guide block constituted of a separate component from the case and fixed integrally with the at least one control terminal, wherein:

the at least one control terminal includes a terminal pin part that protrudes from an outer wall surface of the case, the guide block includes a guide pin part that protrudes from the outer wall surface of the case in a direction in which the terminal pin part protrudes, the at least one control terminal includes two control terminals fixed integrally to the guide block, and respective terminal pin parts of the two control terminals are arranged on a same circumference around a central axis of the guide pin part when viewed in a direction along the central axis.

11. The semiconductor module according to claim 1, wherein the at least one control terminal and the guide block include an integrally molded part.

12. The semiconductor module according to claim 1, wherein respective guide blocks of the plurality of control terminal units are constituted of separate components.

13. The semiconductor module according to claim 9, wherein respective guide blocks of the plurality of control terminal units are constituted of separate components.

14. The semiconductor module according to claim 10, wherein respective guide blocks of the plurality of control terminal units are constituted of separate components.

* * * * *